(12) United States Patent
Biskup

(10) Patent No.: US 10,084,214 B2
(45) Date of Patent: Sep. 25, 2018

(54) AUTOMATIC SWITCHOVER FROM CELL VOLTAGE TO INTERCONNECT VOLTAGE MONITORING

(71) Applicant: Atieva, Inc., Redwood City, CA (US)

(72) Inventor: Richard J. Biskup, Redwood City, CA (US)

(73) Assignee: Atieva, Inc., Newark, CA (US)

( * ) Notice: Subject to any disclaimer, the term of this patent is extended or adjusted under 35 U.S.C. 154(b) by 353 days.

(21) Appl. No.: 13/835,595

(22) Filed: Mar. 15, 2013

(65) Prior Publication Data

US 2014/0272497 A1 Sep. 18, 2014

(51) Int. Cl.
H01M 10/48 (2006.01)
G01R 31/36 (2006.01)
G01R 31/04 (2006.01)

(52) U.S. Cl.
CPC ........ *H01M 10/482* (2013.01); *G01R 31/043* (2013.01); *G01R 31/3658* (2013.01); *Y10T 29/49108* (2015.01)

(58) Field of Classification Search
None
See application file for complete search history.

(56) References Cited

U.S. PATENT DOCUMENTS

| 4,456,965 A | 6/1984 | Graber et al. |
| 4,760,434 A | 7/1988 | Tsuzuki et al. |
| 5,079,608 A | 1/1992 | Wodarczyk et al. |
| 6,108,219 A | 8/2000 | French |
| 6,172,383 B1 | 1/2001 | Williams |
| 6,255,826 B1 * | 7/2001 | Ohsawa ............... B60K 6/28 320/116 |
| 6,286,491 B1 | 9/2001 | Fukatsu et al. |
| 6,639,408 B2 | 10/2003 | Yudahira et al. |
| 6,913,109 B2 | 7/2005 | Kodama |

(Continued)

FOREIGN PATENT DOCUMENTS

| EP | 0992811 | 12/2000 |
| EP | 1676427 | 8/2012 |

(Continued)

OTHER PUBLICATIONS

Goodenough, Frank. "Isolate, Amplify, Multiplex 4+ Channels," Analog Dialogue, 1980, pp. 3-4, vol. 14, No. 2.

(Continued)

*Primary Examiner* — Ula Corinna Ruddock
*Assistant Examiner* — Tony Sheng Hsiang Chuo
(74) *Attorney, Agent, or Firm* — Womble Bond Dickinson (US) LLP

(57) ABSTRACT

A battery assembly is provided. The battery assembly includes a first module having a first plurality of cells and a first voltage measurement device. The battery module includes a sense wire, coupled to a voltage measurement input of the first voltage measurement device and resistively coupled to a terminal of the first plurality of cells. The battery assembly includes a second module having a second plurality of cells and being configured to couple to the first module with the terminal of the first plurality of cells coupling to a terminal of the second plurality of cells via a connector and with the sense wire coupling to the terminal of the second plurality of cells via the connector.

20 Claims, 2 Drawing Sheets

(56) References Cited

U.S. PATENT DOCUMENTS

| | | |
|---|---|---|
| 6,944,695 B1 | 9/2005 | Tangen |
| 6,960,899 B2 | 11/2005 | Kobayashi et al. |
| 7,288,919 B2 | 10/2007 | Morita |
| 7,459,885 B2 | 12/2008 | Miyamoto |
| 7,656,164 B2 | 2/2010 | Kawamura |
| 7,768,034 B2 | 8/2010 | Calafut et al. |
| 7,839,217 B2 | 11/2010 | Okuma |
| 7,924,016 B2 | 4/2011 | Shimizu |
| 8,106,706 B2 | 1/2012 | Easwaran et al. |
| 8,174,237 B2 | 5/2012 | Kosugi et al. |
| 8,212,571 B2 | 7/2012 | Emori et al. |
| 8,222,863 B2 | 7/2012 | Sakakibara |
| 8,231,996 B2 | 7/2012 | Howard et al. |
| 8,334,673 B2 | 12/2012 | Ishikawa |
| 8,354,186 B2 | 1/2013 | Muis |
| 8,542,056 B2 | 9/2013 | Rossi et al. |
| 8,586,230 B2 | 11/2013 | Kim et al. |
| 8,587,318 B2 | 11/2013 | Chandler et al. |
| 8,598,939 B2 | 12/2013 | Shimizu et al. |
| 8,719,477 B2 | 5/2014 | Kaneko |
| 8,729,864 B2 | 5/2014 | Dittmer et al. |
| 8,786,261 B2 | 7/2014 | Andrea |
| 8,868,807 B2 | 10/2014 | Kashima |
| 8,922,165 B2 | 12/2014 | Bills |
| 8,933,665 B2 | 1/2015 | Athas et al. |
| 9,046,584 B2 | 6/2015 | Tsuchiya et al. |
| 2004/0225814 A1 | 11/2004 | Ervin |
| 2006/0139008 A1* | 6/2006 | Park .............................. 320/134 |
| 2007/0188149 A1* | 8/2007 | Miyamoto .................... 320/134 |
| 2008/0220324 A1* | 9/2008 | Phillips et al. ............... 429/120 |
| 2009/0208821 A1* | 8/2009 | Kosugi et al. .................. 429/61 |
| 2011/0066309 A1* | 3/2011 | Matsuoka et al. ............. 701/22 |
| 2012/0194135 A1 | 8/2012 | Mizoguchi |
| 2013/0052514 A1 | 2/2013 | Kim |
| 2013/0066572 A1* | 3/2013 | Terashima ............ H02J 7/0016 702/63 |

FOREIGN PATENT DOCUMENTS

| | | | |
|---|---|---|---|
| EP | 2506390 | 10/2012 | |
| EP | 2538513 | 12/2012 | |
| JP | 2003309982 | 10/2003 | |
| JP | 2007-059088 A * | 3/2007 | ............. H01M 2/20 |
| JP | 2010183766 | 8/2010 | |
| JP | 2012208068 | 10/2012 | |
| KR | 1020060111946 | 10/2006 | |
| KR | 1020100088369 | 8/2010 | |
| KR | 1020110056699 | 5/2011 | |
| KR | 1020120055241 | 5/2012 | |
| WO | WO 2011072939 | 6/2011 | |

OTHER PUBLICATIONS

Notification of Transmittal of the International Search Report and Written Opinion of the International Searching Authority, PCT/US2014/028636, dated Aug. 26, 2014.

Notification of Transmittal of the International Search Report and Written Opinion of the International Searching Authority, PCTUS2014/028658, dated Aug. 13, 2014.

International Search Report, PCT/US2014/028616, dated Jul. 7, 2014.

International Search Report, PCT/US2014/025518, dated Jun. 18, 2014.

International Search Report, PCT/US2014/022807, dated Jul. 3, 2014.

International Search Report and the Written Opinion of the International Searching Authority, PCT/US2014/024861, dated Sep. 18, 2014.

Energizer, Eveready Carbon Zinc., Battery Application Manual. Nov. 6, 2001.

Parks, James E.; Ohms Law III Resistors in Series and Parallel, Department of Physics and Anatomy, University of Tennessee, 2007.

* cited by examiner

US 10,084,214 B2

AUTOMATIC SWITCHOVER FROM CELL VOLTAGE TO INTERCONNECT VOLTAGE MONITORING

BACKGROUND

Modular batteries are made of battery modules. Battery modules allow easy replacement of a defective module. The battery modules can be coupled together in series or parallel or combinations of series and parallel. Smart battery modules have in-module electronic circuits that monitor conditions or aspects of the batteries, such as temperature, cell voltage, current, etc. However, an interconnect defect can occur between battery modules, such as a corroded or damaged connector or wire, which can be difficult to recognize or diagnose. External diagnostic equipment can be applied after a failure, for example by a technician at a repair facility, which is costly and inefficient. It would be desirable to have improvements in onboard or in-system monitoring capability for the battery modules in order to more efficiently test the module prior to assembly into a system.

It is within this context that the embodiments arise.

SUMMARY

In one embodiment, a battery cell module is provided. The battery cell module includes a plurality of cells and a voltage measurement device. The battery cell module includes a sense wire coupled to an input of the voltage measurement device. The battery cell module includes a first connector configured to couple a first terminal of the plurality of cells to a previous battery cell module via two separate conductors of the first connector, so as to make available to the previous battery cell module the first terminal of the plurality of cells as both a power connection and a first sense point. The battery cell module includes a second connector configured to couple a second terminal of the plurality of cells to a next battery cell module and couple the sense wire to the next battery cell module, wherein the next battery cell module couples the sense wire to a second sense point. The battery cell module includes a resistive device coupling the sense wire and the second terminal of the plurality of cells, wherein the first connector and the second connector are configured to couple the previous battery cell module, the battery cell module and the next battery cell module in series.

In another embodiment, a battery assembly is provided. The battery assembly includes a first module having a first plurality of cells and a first voltage measurement device. The battery module includes a sense wire, coupled to a voltage measurement input of the first voltage measurement device and resistively coupled to a terminal of the first plurality of cells. The battery assembly includes a second module having a second plurality of cells and being configured to couple to the first module with the terminal of the first plurality of cells coupling to a terminal of the second plurality of cells via a connector and with the sense wire coupling to the terminal of the second plurality of cells via the connector.

In yet another embodiment, a method of coupling battery modules is provided. The method includes resistively coupling a sense wire of a voltage measurement device to a terminal of a first set of cells, wherein a first battery module includes the voltage measurement device and the first set of cells. The method includes coupling the terminal of the first set of cells to a terminal of a second set of cells via a connector, wherein a second battery module includes the second set of cells. The method includes coupling the sense wire to the terminal of the second set of cells, via the connector and via the second battery module.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
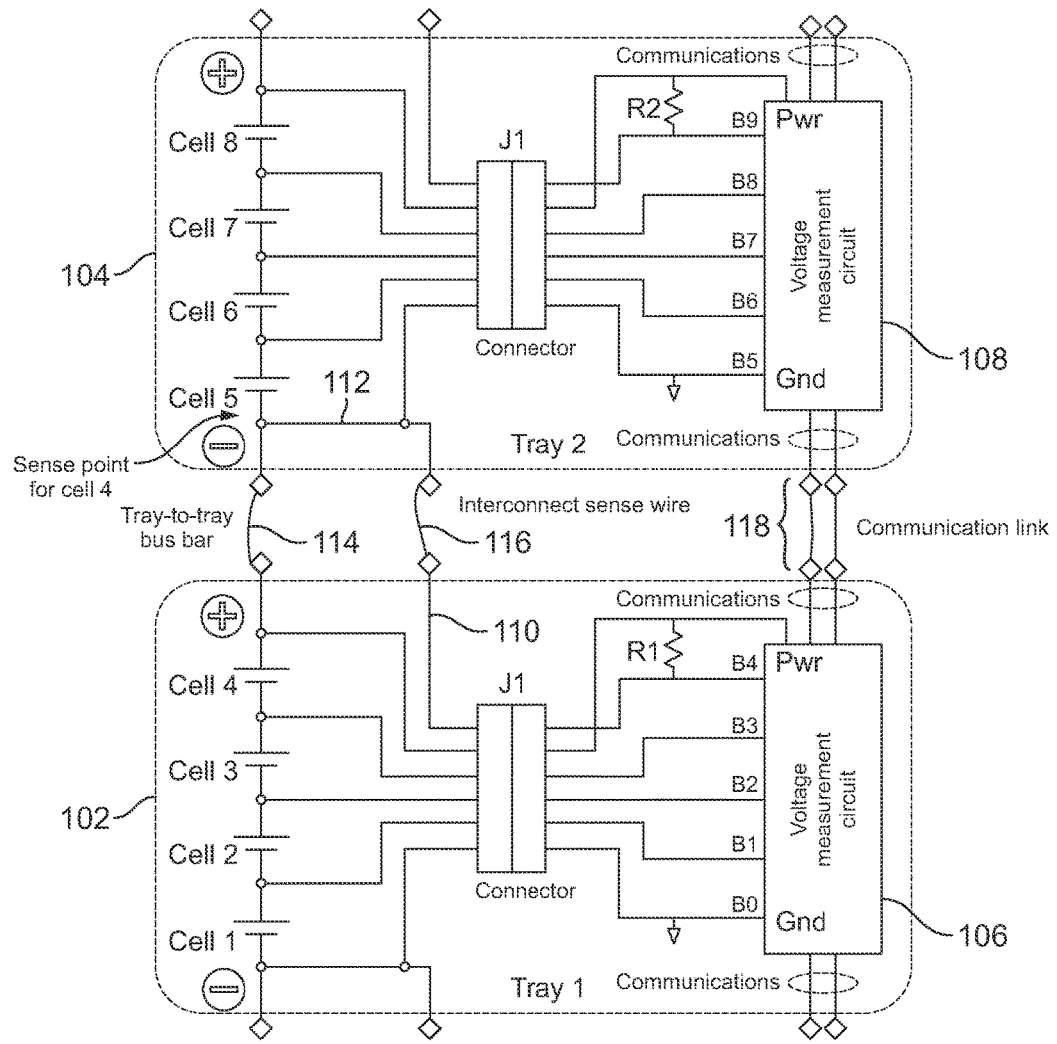
FIG. 1 is a schematic of two battery cell modules coupled together so as to allow interconnect voltage monitoring in accordance with some embodiments.

FIG. 1 shows a battery cell module for monitoring voltage of the cells in the module and the interconnect between modules. A modular battery system is formed by coupling together two or more of the battery cell modules. Each battery cell module can measure voltage of the cells in the battery cell module and can monitor the interconnect when the module is coupled to the next battery cell module. The battery in FIG. 1 is shown with two modules coupled in series, and is illustrative of modular batteries in general. Other batteries could be constructed with additional battery modules in series, or modules in parallel, or combinations of series and parallel modules. Likewise, although the cells inside of each of the modules are shown in series, each module could have cells in parallel or series and parallel. The wiring and circuitry in the battery cell module and in the interconnect between modules, is described further below. This application is related to U.S. application Ser. Nos. 13/794,535, 13/834,983, 13/835,170, 13/835,377, and 13/835,760, each of which is incorporated herein by reference for all purposes.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In FIG. 1, a first battery cell module 102 is coupled to a second battery cell module 104. It should be appreciated that the first battery cell module 102 could be coupled to a previous battery cell module or to a next battery cell module 104, or to both a previous and a next battery cell module 104. Two battery cell modules are provided in FIG. 1 for illustrative purposes and this is not meant to be limiting as any suitable number of battery cell modules may be integrated with the embodiments described herein. Four cells, Cell 1, Cell 2, Cell 3, and Cell 4, are coupled in series in the first battery cell module 102, with a negative terminal of Cell 1 serving as the negative terminal of the battery cell module 102, and a positive terminal of the Cell 4 serving as the positive terminal of the battery cell module 102. Similarly, four cells, Cell 5, Cell 6, Cell 7, and Cell 8, are coupled in series in the second battery cell module 104, with a negative terminal of Cell 5 serving as the negative terminal of the battery cell module 104 and a positive terminal of the Cell 8 serving as the positive terminal of the battery cell module 104.

A voltage measurement device 106 in the first battery cell module 102 is coupled to various nodes of Cell 1, Cell 2, Cell 3, Cell 4 so that cell voltages in the first battery cell module 102 can be measured by the voltage measurement device 106. For example, the negative terminal of Cell 1 is coupled to an input port B0 of the voltage measurement device 106. In this version, the negative terminal of Cell 1 is also coupled to the ground of the voltage measurement device 106. In variations, ground of the voltage measurement device 106 could be from another location. The common terminal of Cell 1 and Cell 2 is coupled to an input port B1 of the voltage measurement device 106. The common terminal of Cell 2 and Cell 3 is coupled to an input port B2 of the voltage measurement device 106. The common terminal of Cell 3 and Cell 4 is coupled to an input port B3 of the voltage measurement device 106. The positive terminal of Cell 4 is coupled to or otherwise provides power for the voltage measurement device 106. In variations, power for the voltage measurement device 106 could be provided from another source. For example, a voltage regulator could couple to one or more cells of the battery module or could draw power from the entire battery module or from another battery module or a group of battery modules, and provide power to the voltage measurement device 106.

Similarly, a voltage measurement device 108 in the second battery cell module 104 is coupled to various nodes of Cell 5, Cell 6, Cell 7, and Cell 8 so that cell voltages in the second battery cell module 104 can be measured by the voltage measurement device 108. It should be appreciated that specific couplings of Cell 5, Cell 6, Cell 7, and Cell 8 to the input ports B5, B6, B7, B8, and B9 are readily devised in accordance with the teachings regarding the first voltage measurement device 106.

A connector couples the first battery cell module 102 and the second battery cell module 104. In one embodiment, the first battery cell module 102 has a first member of the connector, shown as the black diamonds along the upper border of the first battery cell module 102. The second battery module 104 has a second member of the connector, shown as the black diamonds along the lower border of the second battery cell module 104. The first battery module 102 has a duplicate of the second member of the connector, shown as the black diamonds along the lower border of the first battery cell module 102. The second battery module 104 has a duplicate of the first member of the connector, shown as the black diamonds along the upper border of the second battery cell module 104.

In variations, the connector includes a multiple pin connector having two members, a group of four single-pin connectors each having two members, a pair of single-pin connectors with two members and a two-pin connector with two members, or combinations of these. The connector could handle just the power coupling 114 and the sense coupling 116, or could further handle a communication link coupling 118. Further variations are readily devised. Couplings to the connector are as described below. Further details on communication link 118 may be found in application Ser. Nos. 13/794,535, 13/834,983, 13/835,170, 13/835,377, 13/835,760, each of which is incorporated by reference for all purposes.

On battery cell module 102, the positive terminal of Cell 4 is coupled to the connector, specifically to a first conductor of the first member of the connector, with this coupling shown as the left-most black diamond along the upper border of the first battery cell module 102. A sense wire 110 is coupled to one of the input port B4 of the first voltage measurement device 106. The sense wire 110 is also coupled to the connector, specifically to a second conductor of the first member of the connector, with this coupling shown as the second from the left black diamond on the upper border of the first battery cell module 102. In one embodiment, the first sense wire 110 is implemented as a first trace on a printed circuit board in the first battery cell module 102. A resistor R1 couples the sense wire 110 to the positive terminal of Cell 4. In a variation, a resistive device, which could be an active device or a passive device, couples the sense wire 110 to this positive terminal. As a result of this resistive coupling, the voltage measurement device 106 can measure the voltage at the positive terminal of the battery cell module 102 via the sense wire 110 and via a voltage measurement input (e.g., the input port B4) of the voltage measurement device 106. This measurement is possible when the first battery cell module 102 is decoupled from the next battery cell module 104, for example prior to the assembly of a modular battery. It should be appreciated that voltage drop across the resistor R1 is negligible as a result of the high impedance of the input port B4 of the voltage measurement device 106 and correspondingly negligible current through the resistor R1.

On the second battery cell module 104, the negative terminal of Cell 5 is coupled to the connector, specifically to a first conductor of the second member of the connector, with this coupling shown as the left-most black diamond along the lower border of the second battery cell module 104. A sense point (labeled "Sense point for Cell 4") is located physically close to the negative terminal of Cell 5. A second sense wire 112 couples the sense point to a separate conductor of the connector, specifically a second conductor of the second member of the connector, with this conductor shown as the second from the left black diamond on the lower border of the second battery cell module 104. It should be appreciated that with this configuration the second battery cell module 104 can present the negative terminal of the battery cell stack, i.e., the negative terminal of Cell 5, to the first battery cell module 102 as both a power connection and a sense point.

When the first battery cell module 102 is coupled to the second battery cell module 104 by the connector, specifically by mating, joining or otherwise coupling the first member of the connector and the second member of the connector, the following electrical couplings are made. The positive terminal of the battery stack of the first battery cell module 102, i.e., the positive terminal of Cell 4, couples to the negative terminal of the battery stack of the second battery cell module 104, i.e., the negative terminal of Cell 5. This coupling is via the connector, specifically via the first conductor of the connector. This completes a power coupling 114 of the first module 102 and second module 104. The first sense wire 110 is coupled to the second sense wire 112, via the connector, specifically via the second conductor of the connector. This completes a sense coupling 116 of the first module 102 and second module 104. It should be appreciated that the first and second members of the connector each have respective portions of the first and second conductors of the connector, for example as male pins and female sockets, contact plates or other contacting conductive members.

With the first and second battery cell modules 102 and, 104 so coupled, the sense wires 110 and 112 couple the input port B4 of the voltage measurement device 106 of the first battery cell module 102 to the sense point and thus to the negative terminal of Cell 5 of the second battery cell module 104. The voltage measurement device 106 can then measure voltage at the negative terminal of Cell 5. Were it not for the cell-to-cell interconnect resistance, the voltage at the negative terminal of Cell 5 would be the same as the voltage at the positive terminal of Cell 4, because Cell 4 is coupled to Cell 5 by the connector.

However, if the cell-to-cell interconnect resistance is non-negligible, a voltage will show up across the interconnect resistance as a result of current flowing through the interconnect, for example when the battery cell modules are being used to supply power to an electrical device or the battery cell modules are being charged. This will show up as an elevated or depressed reading of the voltage of the sense point, with the battery cell modules 102 and 104 coupled to each other. The voltage measurement device 106, or other device such as a controller or processor connected to the voltage measurement device 106, may then determine that there is an increase in resistance across the interconnect and indicate a fault. In this manner, early warning of increase in resistance could be observed, which could indicate corrosion at the connector or a fraying wire. A much larger voltage or erratic voltage fluctuation could indicate a broken connector or broken wire. A suitably high value of the resistor R1 coupling the sense wire 110 to the positive terminal of Cell 4 should be chosen so that having the resistor R1 in parallel with the cell-to-cell interconnect does not appreciably decrease the overall resistance being monitored by the voltage measurement device 106. It should be appreciated that the total cell-to-cell interconnect resistance from Cell 4 to Cell 5 includes the resistance of the power coupling 114 and other resistance such as resulting from circuit board traces, bus bars, solder, etc. It should be appreciated that the same considerations apply to resistor R2 and any other similarly utilized resistors.

Figure 2:
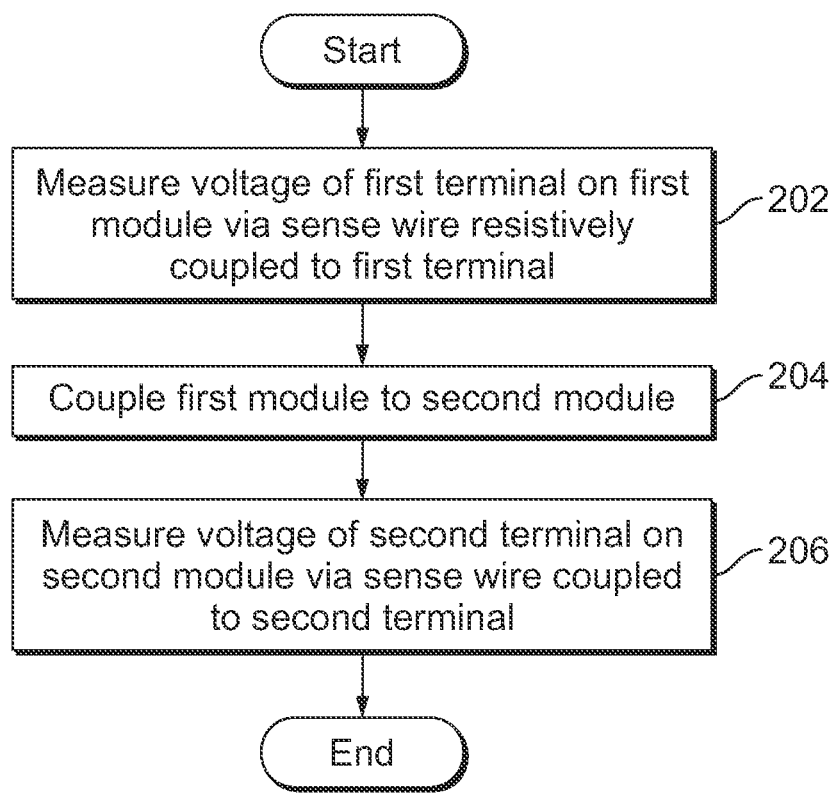
FIG. 2 is a flow diagram of a method of coupling two battery cell modules together to enable interconnect voltage monitoring in accordance with some embodiments.

Thus, with the first battery cell module 102 of FIG. 2 decoupled from the second battery cell module 104, the first voltage measurement device 106 can measure a voltage of the positive terminal of the battery cell stack in the first battery cell module 102. With the first battery cell module 102 coupled to the second battery cell module 104, the first voltage measurement device 106 can measure a voltage of the negative terminal of the battery cell stack in the second battery cell module 104, which is on the opposed side of the power coupling 114. The switchover from one measuring point to the other occurs as the battery cell modules 102, 104 are being coupled together in some embodiments.

A further embodiment can be made by substituting positive for negative, and negative for positive in the embodiment shown in FIG. 1 and in the related description. Still further embodiments can be devised by rearranging couplings to the ports of the voltage measurement devices 106 and 108, by installing one or more connectors, for example the connector J1, to couple and decouple the cell stack from other circuitry on the battery cell modules 102 and 104, by deleting or modifying the communication link 118 and associated circuitry, by adding one or more sensors or one or more processors or controllers, and so on. It should be appreciated that wiring can be accomplished using printed circuit board traces, shielded or unshielded wires, twisted pairs or other wiring.

FIG. 2 shows a method of coupling battery cell modules together. This method can be practiced using the battery cell modules 102 and 104 of FIG. 1 in some embodiments. After a start point, the voltage of the first terminal on the first module is measured via a sense wire resistively coupled to the first terminal, in an action 202. For example, the voltage of the positive terminal of the battery stack on the first module, i.e., the positive terminal of Cell 4 of FIG. 1, is measured by the voltage measurement device of the first module. This measurement is via the sense wire, which is resistively coupled to the positive terminal of Cell 4. The measurement is made with the battery cell modules 102 and 104 decoupled from each other.

The first module is coupled to the second module, in an action 204. This can be accomplished by using the connector, specifically the first and second members of the connector, to couple the first battery cell module to the second battery cell module. The voltage of a second terminal on the second module is measured via a sense wire coupled to the second terminal, in an action 206. For example, the voltage of the negative terminal of the battery cell stack of the second module, i.e., the negative terminal of Cell 5, is measured by the voltage measurement device of the first module. This measurement is via the sense wire, which is coupled via the connector to the sense point on the second battery cell module and thus is coupled to the negative terminal of Cell 5. The method then terminates.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A battery cell module comprising:
a plurality of cells;
a voltage measurement device;
a sense wire coupled to an input of the voltage measurement device;
a first connector configured to couple a first terminal of the plurality of cells to a previous battery cell module via two separate conductors of the first connector, so as to make available to the previous battery cell module the first terminal of the plurality of cells as both a power connection and a first sense point;
a second connector configured to couple a second terminal of the plurality of cells to a next battery cell module via a first conductor of the second connector and couple the sense wire to the next battery cell module via a second conductor of the second connector, wherein the next battery cell module couples the sense wire to a second sense point of the next battery cell module; and
a resistive device coupling the sense wire and the second terminal of the plurality of cells;
wherein the first connector and the second connector are configured to couple the previous battery cell module, the battery cell module and the next battery cell module in series wherein the sense wire is coupled to the second connector;
wherein the voltage measurement device couples to the sense wire and the first conductor of the second connector to detect a cell-to-cell resistance across the second connector; the voltage measurement device configured to detect whether corrosion, a fraying wire, a broken connector or broken wire exists within the second connector, based upon the detected cell-to-cell resistance.

2. The battery cell module of claim 1, wherein the first terminal or the second terminal is coupled to a power supply terminal of the voltage measurement device.

3. The battery cell module of claim 1, wherein the second connector includes: the first conductor coupled to the second terminal of the plurality of cells; and the second conductor coupled to the sense wire.

4. The battery cell module of claim 1, wherein the first sense point is located proximate to the first terminal of the plurality of cells.

5. The battery cell module of claim 1, wherein a negative terminal of the plurality of cells couples to ground of the voltage measurement device.

6. The battery cell module of claim 1, further comprising:
the voltage measurement device configured to measure a voltage of, one or more nodes of the plurality of cells, the one or more nodes being distinct from the first and second terminals.

7. The battery cell module of claim 1, further comprising:
the voltage measurement device configured to measure a voltage of the second terminal of the plurality of cells with the battery cell module not coupled to the next battery cell module.

8. The battery cell module of claim 1, further comprising:
the voltage measurement device configured to measure a voltage of the second sense point of the next battery cell module with the battery cell module coupled to the next battery cell module.

9. The battery cell module of claim 1, wherein the first connector or a further connector includes a communication link.

10. A battery assembly comprising:
a first module having a first plurality of cells and a first voltage measurement device;
a sense wire, coupled to a voltage measurement input of the first voltage measurement device and resistively coupled to a terminal of the first plurality of cells; and
a second module having a second plurality of cells and being configured to couple to the first module with the terminal of the first plurality of cells coupling to a terminal of the second plurality of cells via a first conductor of a first connector and with the sense wire coupling to the terminal of the second plurality of cells via a second conductor of the first connector wherein the sense wire couples to the first connector;
wherein the voltage measurement device couples to the sense wire and the first conductor of the first connector to detect a cell-to-cell resistance across the first conductor of the first connector; the voltage measurement device configured to detect whether corrosion, a fraying wire, a broken connector or broken wire exists within the first connector, based upon the detected cell-to-cell resistance.

11. The battery assembly of claim 10, further comprising:
the terminal of the first plurality of cells being coupled to a power or ground of the first voltage measurement device.

12. The battery assembly of claim 10, further comprising:
a second voltage measurement device, included in the second module and coupled to the second plurality of cells.

13. The battery assembly of claim 10, wherein:
the first connector has a first member included in the first module and a second member included in the second module;
the first member of the first connector has the first conductor coupled to the terminal of the first plurality of cells;
the first member of the first connector has the second conductor coupled to the sense wire;
the second member of the first connector has a third conductor coupled to the terminal of the second plurality of cells; and
the second member of the first connector has a fourth conductor coupled to the terminal of the second plurality of cells.

14. The battery assembly of claim 10, further comprising:
the first connector or a further connector having a communication link coupling the first voltage measurement device to a second voltage measurement device of the second module.

15. The battery assembly of claim 10, wherein:
the sense wire includes a first trace on a first printed circuit board of the first module;
the first trace couples the voltage measurement input of the first voltage measurement device to the first connector;
the sense wire includes a second trace on a second printed circuit board of the second module; and the second trace couples the first connector to the terminal of the second plurality of cells at a sense point proximate to the terminal of the second plurality of cells.

16. The battery assembly of claim 10, wherein:
the terminal of the first plurality of cells is a positive terminal; and the terminal of the second plurality of cells is a negative terminal.

17. The battery assembly of claim 10, wherein:
the terminal of the first plurality of cells is a negative terminal; and the terminal of the second plurality of cells is a positive terminal.

18. The battery assembly of claim 10, wherein the sense wire being resistively coupled to a terminal of the first plurality of cells includes a resistor coupling the sense wire to the terminal of the first plurality of cells.

19. The battery assembly of claim 10, wherein:
the first module is configured so that the first voltage measurement device can measure a voltage of the terminal of the first plurality of cells with the first module decoupled from the second module; and
the first and second modules are configured so that the first voltage measurement device can measure a voltage of the terminal of the second plurality of cells with the first module coupled to the second module.

20. The battery assembly of claim 10, wherein the first voltage measurement device and the sense wire are arranged to detect a voltage arising from interconnect resistance in the first conductor of the first connector.

* * * * *